(12) United States Patent
Llapitan et al.

(10) Patent No.: US 9,603,276 B2
(45) Date of Patent: Mar. 21, 2017

(54) ELECTRONIC ASSEMBLY THAT INCLUDES A PLURALITY OF ELECTRONIC PACKAGES

(71) Applicant: Intel Corporation, Santa Clara, CA (US)

(72) Inventors: David J. Llapitan, Tacoma, WA (US); Jeffory L. Smalley, East Olympia, WA (US); Gaurav Chawla, Tempe, AZ (US); Joshua D Heppner, Chandler, AZ (US); Vijaykumar Krithivasan, Chandler, AZ (US); Jonathan W. Thibado, Beaverton, OR (US); Kuang Liu, Queen Creek, AZ (US); Gregorio Murtagian, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/583,372

(22) Filed: Dec. 26, 2014

(65) Prior Publication Data

US 2016/0190717 A1   Jun. 30, 2016

(51) Int. Cl.
*H01R 12/00* (2006.01)
*H05K 7/10* (2006.01)

(52) U.S. Cl.
CPC .................. *H05K 7/1084* (2013.01)

(58) Field of Classification Search
CPC .. H01R 12/7047; H01R 43/205; H01R 13/93; H01R 13/514; G01R 1/04; H04B 1/3838
USPC ....................... 439/75, 70–71, 701
See application file for complete search history.

(56) References Cited

U.S. PATENT DOCUMENTS

| | | | |
|---|---|---|---|
| 4,402,563 A | 9/1983 | Sinclair | |
| 4,986,778 A * | 1/1991 | Liken | G01R 1/04 324/537 |
| 6,217,361 B1 * | 4/2001 | Murr | H01R 13/193 439/342 |

(Continued)

FOREIGN PATENT DOCUMENTS

| | | |
|---|---|---|
| JP | 7106461 A | 4/1995 |
| JP | 2000173735 A | 6/2000 |

(Continued)

OTHER PUBLICATIONS

"Japanese Application Serial No. 2015-225046, Office Action mailed Oct. 18, 2016", W/ English Translation, 6 pgs.

(Continued)

*Primary Examiner* — Jean F Duverne
(74) *Attorney, Agent, or Firm* — Schwegman Lundberg & Woessner, P.A.

(57) ABSTRACT

Some forms relate to an electronic assembly that includes a plurality of electronic package. The electronic assembly includes a frame and a first electronic package mounted on the frame. The first electronic package includes a first pin grid array. The electronic assembly further includes a second electronic package mounted on the frame. The second electronic package includes a second pin grid array. The electronic assembly further includes an actuation mechanism on the frame. The actuation mechanism is configured to move the first electronic package and the second electronic package relative to the frame during operation of the actuation mechanism.

22 Claims, 7 Drawing Sheets

(56) References Cited

U.S. PATENT DOCUMENTS

| | | | | |
|---|---|---|---|---|
| 6,527,597 | B1* | 3/2003 | Harper, Jr. | H01R 13/514 439/701 |
| 6,624,432 | B1* | 9/2003 | Gabower | H04B 1/3838 174/384 |
| 7,456,483 | B2* | 11/2008 | Tsukamoto | H01L 27/14618 257/433 |
| 2003/0096514 | A1* | 5/2003 | Ho | H05K 1/141 439/70 |
| 2004/0222514 | A1* | 11/2004 | Crane, Jr. | H05K 7/1061 257/697 |

FOREIGN PATENT DOCUMENTS

| | | |
|---|---|---|
| JP | 2001250654 A | 9/2001 |
| JP | 2002313510 A | 10/2002 |
| JP | 2002324644 A | 11/2002 |
| JP | 2002352929 A | 12/2002 |
| JP | 2003157938 A | 5/2003 |
| JP | 2016129219 A | 7/2016 |
| KR | 1020160079644 A | 7/2016 |

OTHER PUBLICATIONS

"Japanese Application Serial No. 2015-230138, Office Action mailed Nov. 1, 2016", with English Translation, 6 pgs.

\* cited by examiner

ELECTRONIC ASSEMBLY THAT INCLUDES A PLURALITY OF ELECTRONIC PACKAGES

TECHNICAL FIELD

Some example embodiments of the present invention relate to an electronic assembly that includes a plurality of electronic packages, and more particularly to an electronic that includes a plurality of electronic packages where the electronic assembly engages a socket.

BACKGROUND

The processors in integrated circuits and other electronic assemblies are continually being required to handle an ever-increasing number of signals. A typical processor often requires additional signals in order to operate at higher frequencies and to simultaneously perform more logic and memory operations.

Electronic assemblies are often used to connect and secure electronic packages that include processors onto a system board (e.g., a mother board or a printed circuit board (PCB)). Most electronic assemblies are typically constructed for easy installation and replacement of the electronic assemblies onto sockets. Many sockets include contacts that are assembled within the socket to provide an electrical connection between the system board and the electronic assemblies.

Configurable memory for on package memory applications typically includes electronic packages that are connected under stringent space requirements. The volumetrics are very constrained due to limited form factor space on the substrates where the electronic assemblies are usually mounted.

Many of the conventional electronic assemblies (e.g., a Low Insertion Force Connector) typically require too much force to insert, or enable, an electronic package on to a socket and often exceed ergonomic requirements. A specialized tool is also usually needed in order to install the electronic assembly on to a socket. In addition, when multiple electronic assemblies are mounted to a substrate an undesirably large keep out zone is typically required on the substrate.

DETAILED DESCRIPTION

The following detailed description references the accompanying drawings. Like numerals describe substantially similar components throughout each of the drawings. Other embodiments may be used, and structural, logical, and electrical changes made. The electronic assemblies and electronic systems described herein can be manufactured, used, or shipped in a number of positions and orientations.

The example electronic assemblies and electronic systems described herein may allow for two or more packages per electronic assembly and reduce the insertion force to none. In addition, the example electronic assemblies and electronic systems described herein may not require specialized tools to mount an electronic package to a socket.

By using only one frame for two packages, the contribution of electronic assembly height to tolerance buildup may be reduced resulting in improved heat sink contact. The configuration of some of the electronic assemblies described herein may allow for electronic package memory to be installed over existing features on the substrate (e.g., a socket load frame). Installing electronic package memory over existing features on the substrate may further optimize the use of space.

FIGS. 1-6 illustrate a portion of an example electronic assembly 10. The example assembly 10 includes a frame 11. In some forms, the example electronic assembly 10 may further include a first pin carrier 12A and a second pin carrier 12B. The first pin carrier 12A includes a first pin grid array and the second pin carrier 12B includes a second pin grid array.

The example electronic assembly 10 further includes an actuation mechanism 14. The actuation mechanism 14 is configured to engage the first pin grid array with a first plurality electrical contacts on a socket 23 (socket 23 shown only in FIGS. 7-10). The actuation mechanism 14 is configured to engage the second pin grid array with a second plurality of electrical contacts on the socket 23. In some forms, the first pin grid array may engage first plurality electrical contacts while second pin grid array simultaneously engages the second plurality electrical contacts The electronic assembly 10 further includes first and second electronic packages 13A, 13B that are not shown in FIGS. 1-6. The first and second electronic packages 13A, 13B are shown later in FIGS. 7-10 relative to electronic assemblies 10 and the electronic systems 20 described herein.

It should be noted that the actuation mechanism 14 may be any type of actuation mechanism that is known now or discovered in the future. The type of actuation mechanism 14 that is included in the socket 10 will depend in part on the size of the frame 11 and the types of electronic packages 13A, 13B that are to be connected to the socket 23 (among other factors).

In the example actuation mechanism 14 illustrated in FIGS. 1-6, the actuation mechanism 14 is a cam mechanism positioned between the first pin carrier 12A and the second pin carrier 12B. In alternative forms, the actuation mechanism 14 may be positioned in other locations relative to the first pin carrier 12A and the second pin carrier 12B.

As shown in FIGS. 3-6, the first pin carrier 12A and the second pin carrier 12B move relative to the frame 11 during operation of the actuation mechanism 14. Although the first pin carrier 12A and the second pin carrier 12B are illustrated as moving linearly relative to the frame 11 (compare FIGS. 3 and 4 and also compare FIGS. 5 and 6), other forms are contemplated where the first pin carrier 12A and the second pin carrier 12B move non-linearly relative to the frame 11 (e.g., rotationally).

In the example electronic assemblies 10 shown in FIGS. 1-6, the frame 11 surrounds the first pin carrier 12A and the frame 11 surrounds the second pin carrier 12B. The configuration of the frame 11 relative to the first pin carrier 12A and the second pin carrier 12B will depend in part (i) the size, type and configuration of the first and second pin carriers 12A, 12B on (i) the size, type and configuration of the first and second electronic packages 13A, 13B; and/or (ii) the size, type and configuration of the first and second pin grid arrays (among other factors).

In the example socket 23 described herein, the socket 23 includes the first plurality electrical contacts and the second plurality electrical contacts. The number and type of contacts in the first plurality electrical contacts and the second plurality electrical contacts will depend in part (i) the size and type of electronic packages 13A, 13B that are to be connected to the socket 23; and (ii) the size and type of pins that are used to electrically connect electronic packages 13A, 13B to the socket 23 (among other factors).

As shown in FIGS. 3-6, a portion 17 of the actuation mechanism 14 is rotated to move the first pin carrier 12A and the second pin carrier 12B relative to the frame 11. It should be noted that other types of devices are contemplated to move the first pin carrier 12A and the second pin carrier 12B relative to the frame 11 (e.g., a lever).

FIGS. 7-10 illustrate an example electronic system 20. The electronic system 20 includes any of the example electronic assemblies 10 described herein. As discussed above, the electronic assembly 10 further includes a first electronic package 13A and a second electronic package 13B.

Although each of the FIGS. 7-10 shows the electronic assembly 10 as including the first pin carrier 12A and the second pin carrier 12B, example forms are contemplated where the electronic assembly 10 does not include the first pin carrier 12A and the second pin carrier 12B. As an example, the first electronic package 13A may include the first pin grid array and the second electronic package 13B may include the second pin grid array.

It should be noted that the number, location and size of the pins in each pin grid array will depend in part on the type of first and second electronic packages 13A, 13B that are included in the electronic assembly 10 as well as the type of applications where the electronic assembly 10 will be used. In addition, the first electronic package 13A may be the same size as the second electronic package 13B or the first electronic package 13A may be a different size than the second electronic package 13B.

The actuation mechanism 14 is configured to engage the first plurality electrical contacts in the socket 23 with the first pin grid array on the first pin carrier 12A. The actuation mechanism 14 is also configured to engage the second plurality electrical contacts in the socket 23 with the second pin grid array on the second pin carrier 12B.

As discussed above, the electronic assembly 10 may further include a first pin carrier 12A attached to the first electronic package 13A. The first pin carrier 12A includes the first pin grid array. The electronic assembly 10 may further include a second pin carrier 12B attached to the second electronic package 13B. The second pin carrier 12B includes the second pin grid array. The size, type and configuration of the first and second pin carriers 12A, 12B will depend in part on (i) the size and type of the first and second electronic packages 13A, 13B; (ii) the size and type of the first and second pin grid arrays; and/or (iii) the size and type of socket 23 that is used in the electronic system 20.

The electronic assembly 10 uses a single actuation mechanism 14 to secure first and second electronic packages 13A, 13B. If two or more separate actuation mechanisms were used, then valuable XY space would be wasted on a substrate 30 (see FIG. 10) where the electronic system(s) 20 are mounted.

The need to operate only a single actuation mechanism 14 may also require less assembly time to fabricate the electronic assembly 10. It should be noted that forms of the electronic assembly 10 are contemplated where a single actuation mechanism 14 is used to secure more than two electronic packages (or more than two pin carriers).

As shown in FIGS. 7-10, the socket 23 may include a first socket 24A and a second socket 24B. In some forms, the first pin grid array is mounted on the first socket 24A and the second pin grid array is mounted on the second socket 24B. In some forms, the first socket 24A and the second socket 24B may be separated such that an additional electronic component may be mounted between the first socket 24A and the second socket 24B thereby saving valuable space on a substrate 30 where the first socket 24A and the second socket 24B are mounted. In other forms, where the actuation mechanism 14 is not between the first socket 24A and the second socket 24B, there may be additional space under the actuation mechanism 14 (wherever the actuation mechanism 14 may be located).

Figure 10:
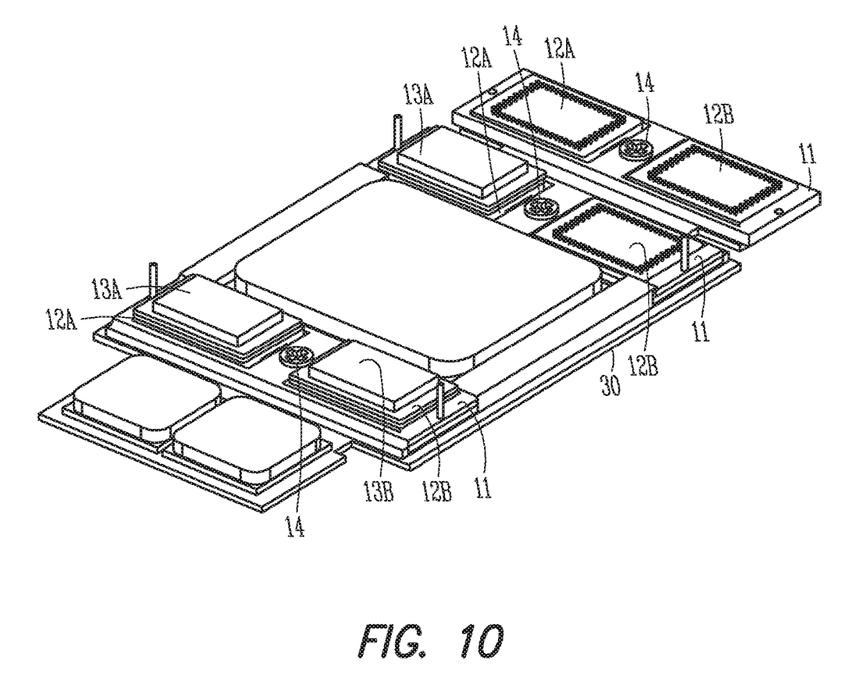
FIG. 10 is a perspective view illustrating an example electronic device that includes several of the electronic systems shown in FIGS. 6-9 mounted onto a substrate.

In addition, either one, both, or none of the first and second electronic packages 13A, 13B may be installed in the sockets 24A, 24B any given time (see FIG. 10). As an example, the socket 10 may be designed such that turning the portion 17 of the mechanism 14 would either (i) push both electronic packages 13A, 13B; or (ii) push one electronic package and pull the other electronic package to engage the first and second pin grid arrays with the sockets 24A, 24B.

In the example electronic systems 20 illustrated in FIGS. 7-10, the actuation mechanism 14 is a cam mechanism positioned between the first electronic package 13A and the second electronic package 13B. In alternative forms, the actuation mechanism 14 may be positioned in other locations relative to the first electronic package 13A and the second electronic package 13B.

As shown in FIG. 10, the sockets 24A, 24B may be mounted to a substrate 30 (e.g., an interposer). In some forms, the substrate 30 may be a printed circuit board such that the sockets 24A, 24B are mounted to the printed circuit board. As an example, the sockets 24A, 24B may be mounted to the printed circuit board using a ball grid array.

The electronic assembly 20 may further include a socket load frame (not shown) mounted to the substrate 30. The socket load frame may surround all, or part, of the sockets 24A, 24B. In some forms, at least one of the first electronic package 13A and the second electronic package 13B may extend over (i.e., overlap) the socket load frame.

As an example, a larger electronic package (e.g., a memory module) may be used in the electronic assembly 20 since the larger electronic package may overlap the socket load frame 32. In some forms, this extra space may be used for passive components, routing, interposer, etc.

Figure 11:
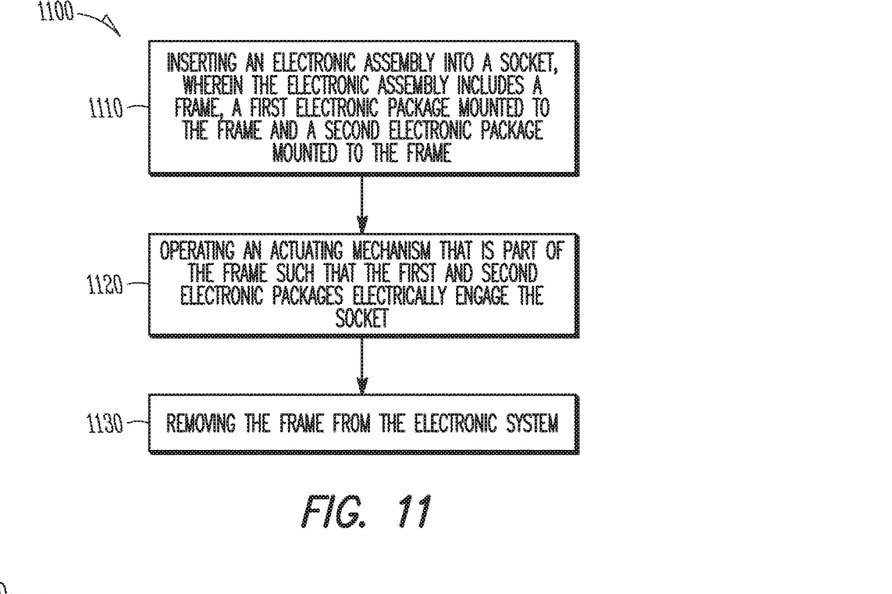
FIG. 11 is a flow diagram illustrating an example method of forming an electronic system.

FIG. 11 shows a method [1100] of forming an electronic system 20. The method [1100] includes [1110] inserting an electronic assembly 10 into a socket(s) 24A, 24B, wherein the electronic assembly 10 includes a frame 11, a first electronic package 13A mounted to the frame 11 and a second electronic package mounted 13B to the frame 11. The method [1100] further includes [1120] operating an actuating mechanism 14 that is part of the frame 11 such that the first and second electronic packages 13A, 13B electrically engage the socket(s) 24A, 24B. The manner in which the first pin grid array on the first electronic package 13A and the second pin grid array on the second electronic package 13B will depend in part on the size, type and arrangement of the respective pins and contacts.

Figure 1:
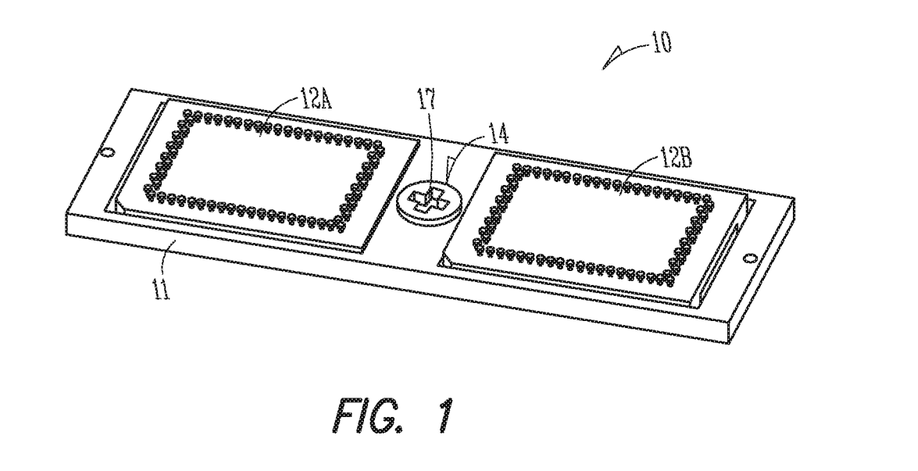
FIG. 1 is a perspective view illustrating a portion of an example electronic assembly.
Figure 2:
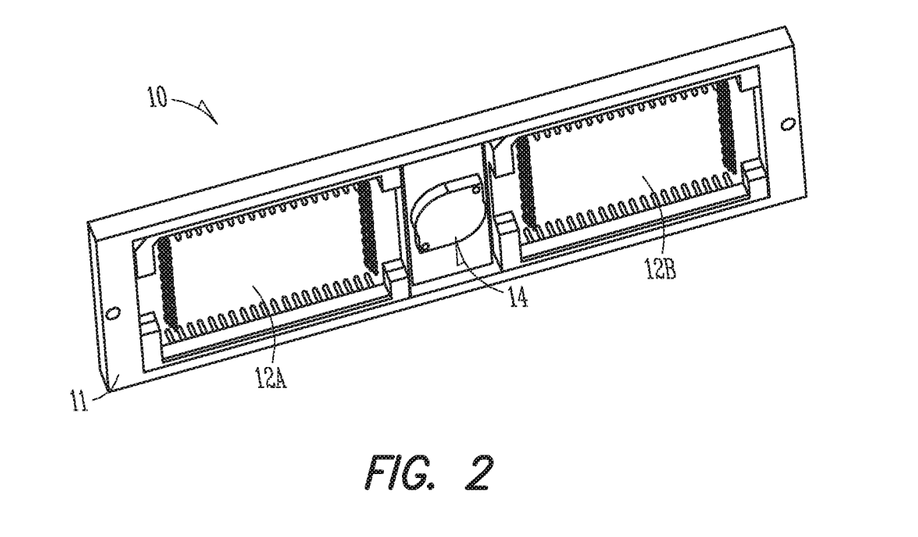
FIG. 2 is another perspective view of the portion of the example electronic assembly shown in FIG. 1.
Figure 3:
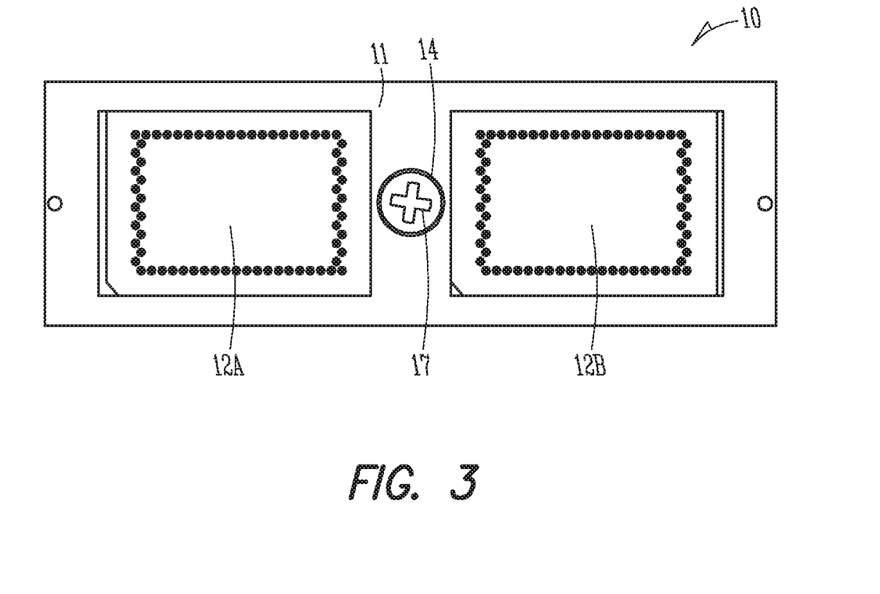
FIG. 3 is top view of the portion of the electronic assembly shown in FIGS. 1 and 2.
Figure 4:
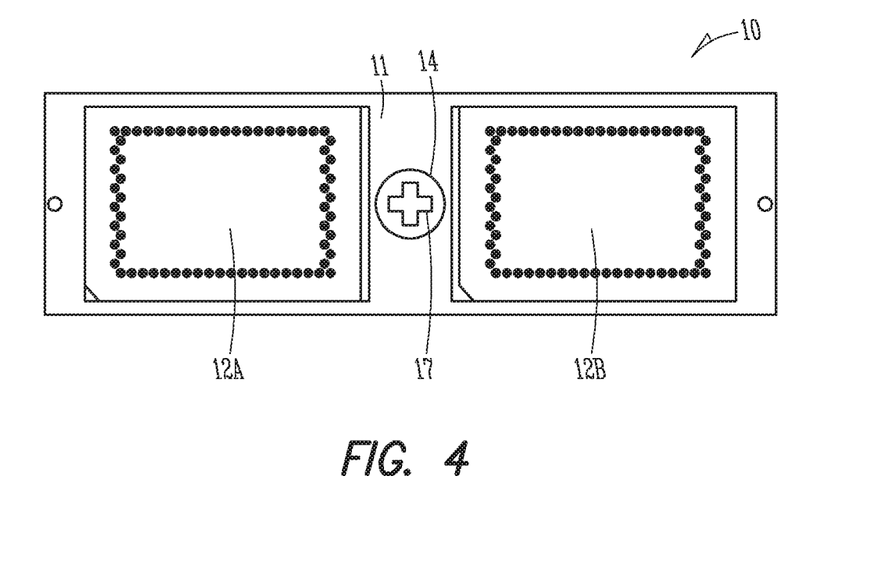
FIG. 4 is top view of the portion of the electronic assembly shown in FIG. 3 where portions of the electronic assembly have been moved relative to a frame of the electronic assembly.
Figure 5:
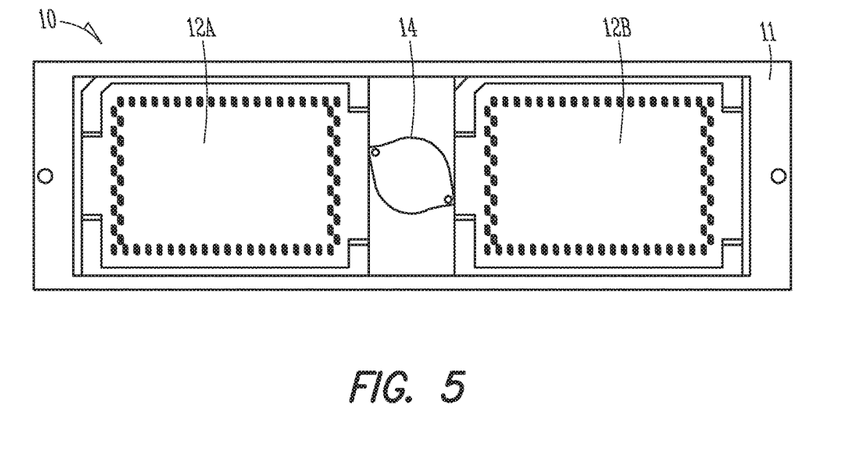
FIG. 5 is bottom view of the portion of the electronic assembly shown in FIGS. 1 and 2.
Figure 6:
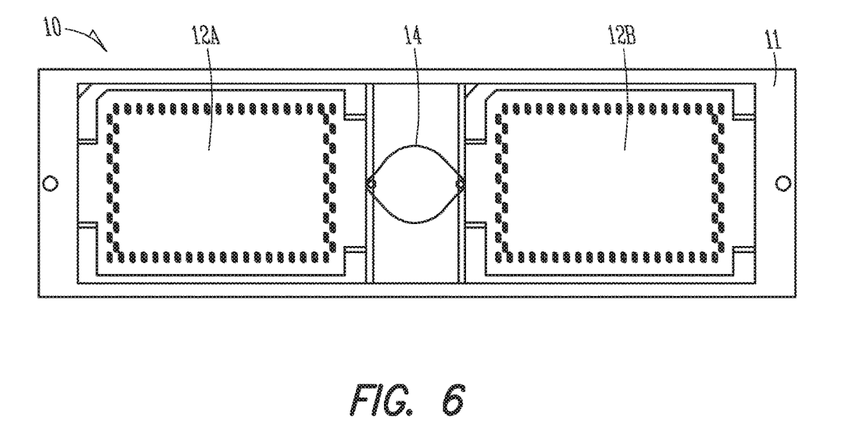
FIG. 6 is bottom view of the portion of the electronic assembly shown in FIG. 5 where portions of the electronic assembly have been moved relative to a frame of the electronic assembly.
Figure 7:
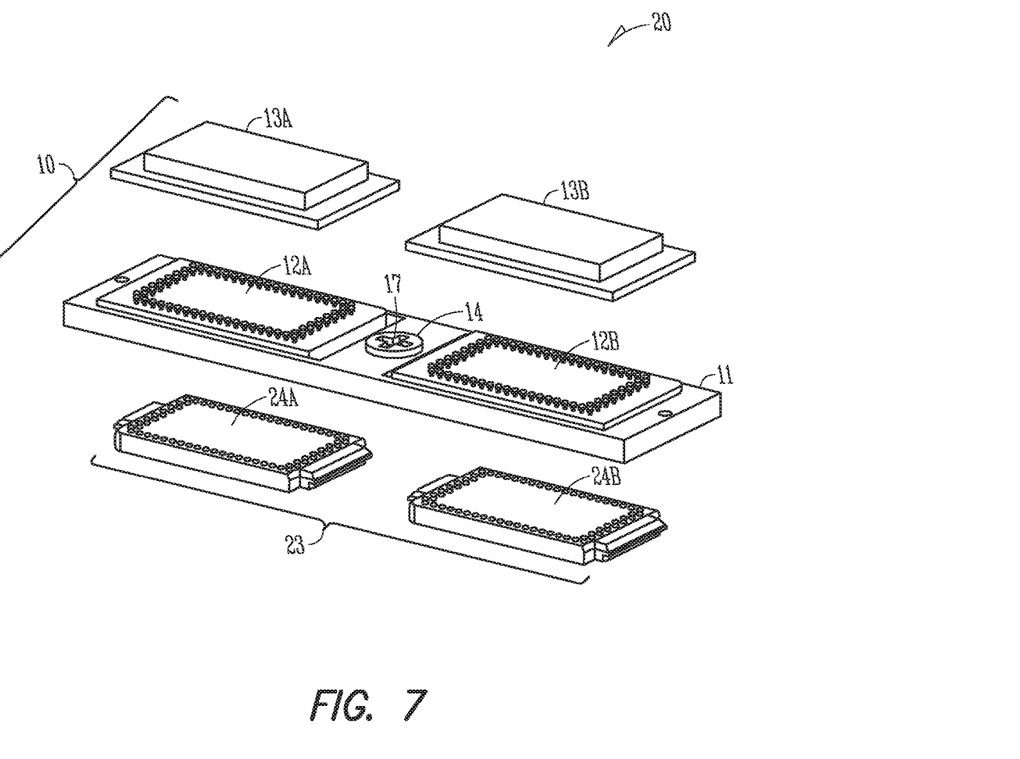
FIG. 7 is a partially exploded perspective view illustrating an example electronic system.
Figure 8:
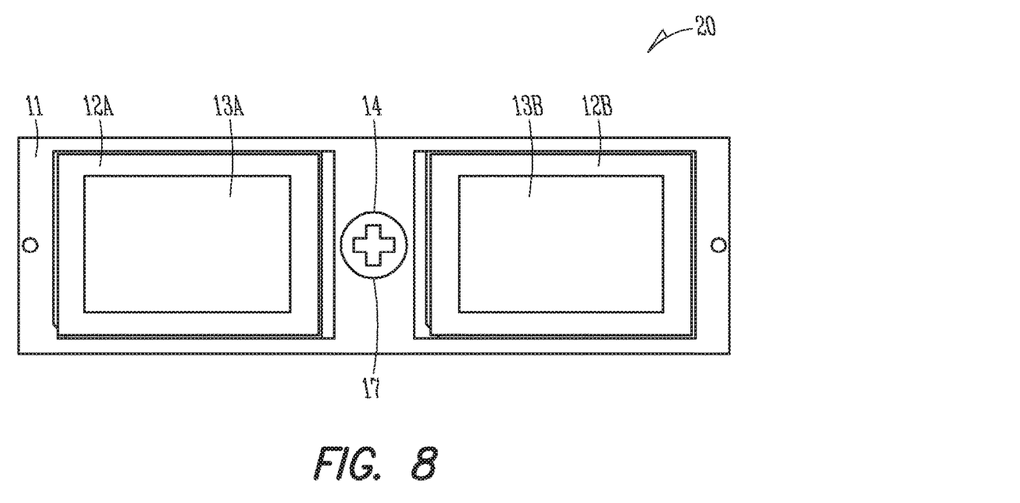
FIG. 8 is a top view of the electronic system shown in FIG. 7.
Figure 9:
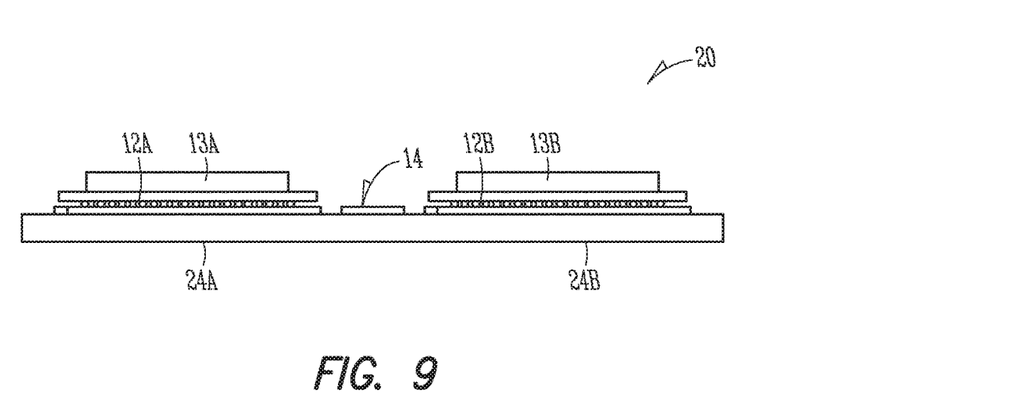
FIG. 9 is a side view of the electronic system shown in FIG. 7.

As shown in FIGS. 4 and 6, [1120] operating the actuating mechanism 14 may include rotating a portion 17 of the actuation mechanism 14. It should be noted that other types of devices are contemplated to move the first and second electronic packages 13A, 13B relative to the socket(s) 24A, 24B. In addition, the portion 17 may be moved in other ways besides rotating (e.g., linear motion using a lever).

In some forms, [1110] inserting an electronic assembly 10 into a socket(s) 24A, 24B may include inserting a first pin grid array of the first electronic package 13A into a first pin receiving field formed in the socket 24A and inserting a second pin grid array of the second electronic package 13B into a second pin receiving field formed in the socket 24B. In some forms, [1110] inserting a first pin grid array of the first electronic package 13A into a first pin receiving field formed in the socket 24A may include inserting a first pin carrier 12A that includes the first pin grid array into the first pin receiving field where the first electronic package 13A is attached to the first pin carrier 12A. In addition, [1110] inserting a second pin grid array of the second electronic package 13B into a second pin receiving field formed in the socket 24B may include inserting a second pin carrier 12B that includes the second pin grid array into the second pin receiving field where the second electronic package 13B is attached to the second pin carrier 12B.

The method [1100] may further include [1130] removing the frame 11 from the electronic system 20. The manner in which the frame 11 is removed from the electronic system 20 will depend in part on (i) the size, type and configuration of the first and second pin carriers 12A, 12B (ii) the size, type and configuration of the first and second electronic packages 13A, 13B; (iii) the size, type and configuration of the first and second pin grid arrays; and/or (iv) the size, type and configuration of the socket 23 that is used in the electronic system 20 (among other factors).

The electronic systems, electronic assemblies and methods described herein may require zero insertion force and may not require a custom tool requirement for assembly, and electronic system robustness. In addition, the electronic systems, electronic assemblies and methods described herein may allow electronic packages to be installed at any convenient time in the manufacturing process and/or system assembly, or as part of performing service or maintenance.

The electronic systems and electronic assemblies described herein may be implemented in a number of different forms. The elements, materials, geometries, and dimensions can all be varied to suit particular packaging requirements.

Figure 12:
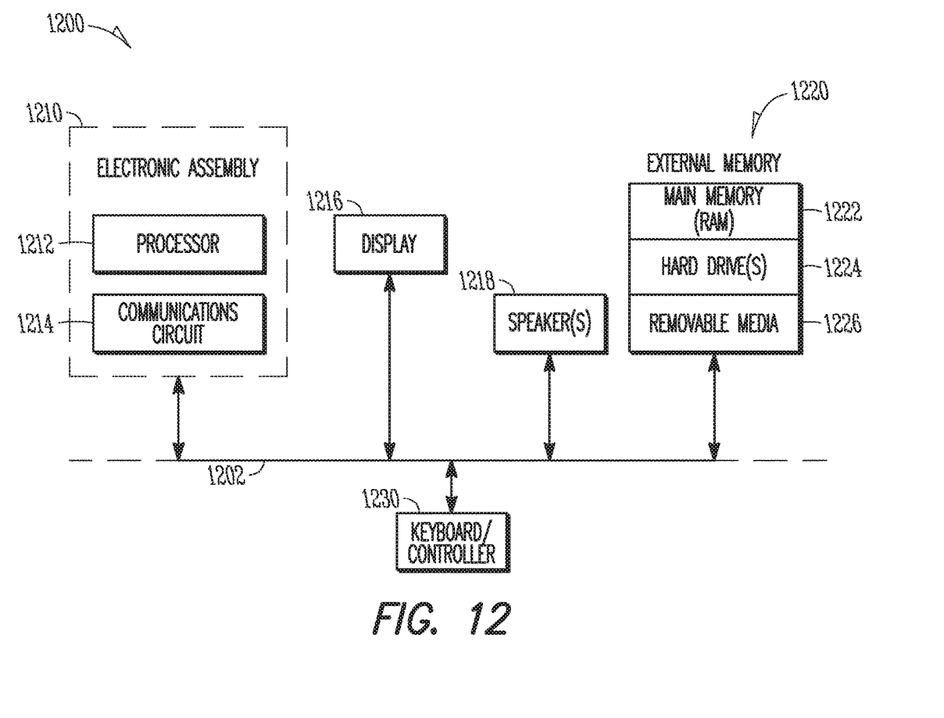
FIG. 12 is a block diagram of an electronic apparatus that includes the electronic assemblies and/or the electronic systems described herein.

FIG. 12 is a block diagram of an electronic apparatus 1200 incorporating at least one electronic assembly 10, electronic system 20 and/or method [1100] described herein. Electronic apparatus 1200 is merely one example of an electronic apparatus in which forms of the electronic assemblies 10, electronic systems 20 and/or methods [1100] described herein may be used.

Examples of an electronic apparatus 1200 include, but are not limited to, personal computers, tablet computers, mobile telephones, game devices, MP3 or other digital music players, etc. In this example, electronic apparatus 1200 comprises a data processing system that includes a system bus 1202 to couple the various components of the electronic apparatus 1200. System bus 1202 provides communications links among the various components of the electronic apparatus 1200 and may be implemented as a single bus, as a combination of busses, or in any other suitable manner.

An electronic assembly 1210 that includes at least one electronic assembly 10, electronic system 20 and/or method [1100] described herein may be coupled to system bus 1202. The electronic assembly 1210 may include any circuit or combination of circuits. In one embodiment, the electronic assembly 1210 includes a processor 1212 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic assembly 1210 are a custom circuit, an application-specific integrated circuit (ASIC), or the like, such as, for example, one or more circuits (such as a communications circuit 1214) for use in wireless devices like mobile telephones, tablet computers, laptop computers, two-way radios, and similar electronic systems. The IC can perform any other type of function.

The electronic apparatus 1200 may also include an external memory 1220, which in turn may include one or more memory elements suitable to the particular application, such as a main memory 1222 in the form of random access memory (RAM), one or more hard drives 1224, and/or one or more drives that handle removable media 1226 such as compact disks (CD), flash memory cards, digital video disk (DVD), and the like.

The electronic apparatus 1200 may also include a display device 1216, one or more speakers 1218, and a keyboard and/or controller 1230, which can include a mouse, trackball, touch screen, voice-recognition device, or any other device that permits a system user to input information into and receive information from the electronic apparatus 1200.

To better illustrate the methods, sockets and electronic assemblies disclosed herein, a non-limiting list of embodiments is provided herein.

Example 1 includes an electronic assembly. The electronic assembly includes a frame and a first electronic package mounted on the frame. The first electronic package includes a first pin grid array. The electronic assembly further includes a second electronic package mounted on the frame. The second electronic package includes a second pin grid array. The electronic assembly includes an actuation mechanism on the frame. The actuation mechanism is configured to move the first electronic package and the second electronic package relative to the frame during operation of the actuation mechanism.

Example 2 includes the electronic assembly of example 1, wherein the actuation mechanism is a cam mechanism.

Example 3 includes the electronic assembly of any one of examples 1-2, wherein the actuation mechanism is between the first electronic package and the second electronic package.

Example 4 includes the electronic assembly of any one of examples 1-3, and further including a first pin carrier mounted to the first electronic package. The first pin carrier includes the first pin grid array. A second pin carrier is mounted to the second electronic package. The second pin carrier includes the second pin grid array. The actuation mechanism is configured to move the first pin carrier and the second pin carrier relative to the frame during operation of the actuation mechanism.

Example 5 includes the electronic assembly of example 4, wherein the frame surrounds the first pin carrier and the frame surrounds the second pin carrier.

Example 6 includes the electronic assembly of any one of examples 4-5, wherein a portion of the actuation mechanism is rotated to move the first pin carrier and the second pin carrier relative to the frame during operation of the actuation mechanism.

Example 7 includes an electronic system. The electronic system includes an electronic assembly that includes a frame and a first electronic package mounted to the frame. The first electronic package includes a first pin grid array. The electronic assembly further includes a second electronic package mounted to the frame. The second electronic package includes a second pin grid array. The electronic assembly further includes a socket that includes a first receiving pin field and a second receiving pin field. The first pin receiving field includes a first plurality electrical contacts and the second pin field includes a second plurality electrical contacts. An actuation mechanism is configured to engage the first pin grid array with the first plurality electrical contacts and the second pin grid array with the second plurality electrical contacts during operation of the actuation mechanism.

Example 8 includes the electronic system of example 7, wherein the actuation mechanism is between the first electronic package and the second electronic package.

Example 9 includes the electronic system of any one of examples 7-8, wherein the socket includes a first socket that includes the first pin receiving field and a second socket that includes the second pin receiving field.

Example 10 includes the electronic system of any one of examples 7-9, and further including a first pin carrier attached to the first electronic package. The first pin carrier includes the first pin grid array. A second pin carrier is attached to the second electronic package. The second pin carrier includes the second pin grid array.

Example 11 includes the electronic system of any one of examples 7-10, wherein the first electronic package is a same size as the second electronic package.

Example 12 includes the electronic system of any one of examples 7-11, wherein the housing is mounted to a substrate.

Example 13 includes the electronic system of any of examples 10-12, wherein the first pin carrier and the second pin carrier move linearly relative to the frame during operation of the actuation mechanism.

Example 14 includes a method that includes inserting an electronic assembly into a socket. The electronic assembly includes a frame, a first electronic package mounted to the frame and a second electronic package mounted to the frame. The method further includes operating an actuating mechanism that is part of the frame such that the first and second electronic packages electrically engage the socket.

Example 15 includes the method of example 14, wherein operating the actuating mechanism includes rotating a portion of the actuation mechanism.

Example 16 includes the method of any one of examples 14-15, wherein inserting an electronic assembly into a socket includes inserting a first pin grid array of the first electronic package into a first pin receiving field formed in the socket and inserting a second pin grid array of the second electronic package into a second pin receiving field formed in the socket.

Example 17 includes the method of example 16, wherein operating the actuating mechanism includes operating the actuating mechanism such that the first pin grid array engages a first plurality of contacts in the first pin receiving field and the second pin grid array engages a second plurality of contacts in the second pin receiving field.

Example 18 includes the method of any one of examples 16-17, wherein inserting the first pin grid array into the first pin receiving field includes inserting a first pin carrier that includes the first pin grid array into the first pin receiving field, wherein the first electronic package is attached to the first pin carrier, and wherein inserting the second pin grid array into the second pin receiving field includes inserting a second pin carrier that includes the second pin grid array into the second pin receiving field, wherein the second electronic package is attached to the second pin carrier.

Example 19 includes the method of any one of examples 16-18, wherein inserting the first pin grid array into the first pin receiving field includes inserting the first pin grid array into a first socket and inserting the second pin grid array into the second pin receiving field includes inserting the second pin grid array into a second socket.

Example 20 includes the method of any one of examples 14-19, and further including removing the frame from the electronic system.

This overview is intended to provide non-limiting examples of the present subject matter. It is not intended to provide an exclusive or exhaustive explanation. The detailed description is included to provide further information about the methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. In addition, the order of the methods described herein may be in any order that permits fabrication of an electrical interconnect and/or package that includes an electrical interconnect. Other embodiments can be used, such as by one of ordinary skill in the art upon reviewing the above description.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed:

1. An electronic assembly comprising:
    a frame formed from a unitary piece of material;
    a first electronic package mounted on the frame, the first electronic package including a first pin grid array;
    a second electronic package mounted on the frame and separated laterally from the first electronic package, the second electronic package including a second pin grid array, the frame laterally surrounding the first and second electronic package; and
    an actuation mechanism on the frame, the actuation mechanism being configured to simultaneously move the first electronic package and the second electronic package laterally relative to the frame during operation of the actuation mechanism.

2. The electronic assembly of claim 1, wherein the actuation mechanism is a cam mechanism.

3. The electronic assembly of claim 1, wherein the actuation mechanism is disposed laterally between the first electronic package and the second electronic package.

4. The electronic assembly of claim 1, further comprising:
    a first pin carrier mounted to the first electronic package, the first pin carrier including the first in grid array; and
    a second pin carrier mounted to the second electronic package, the second in carrier including the second pin grid array,
    wherein the actuation mechanism is configured to move the first pin carrier and the second pin carrier relative to the frame during operation of the actuation mechanism.

5. The electronic assembly of claim 4, wherein the frame surrounds the first pin carrier and the frame surrounds the second pin carrier.

6. The electronic assembly of claim 4, wherein a portion of the actuation mechanism is rotated to move the first pin carrier and the second pin carrier laterally relative to the frame during operation of the actuation mechanism.

7. The electronic assembly of claim 1, wherein the actuation mechanism is configured to move the first electronic package and the second electronic package laterally in different directions during operation of the actuation mechanism.

8. The electronic assembly of claim 1, wherein the actuation mechanism is configured to move the first electronic package and the second electronic package laterally in a same direction during operation of the actuation mechanism.

9. An electronic system comprising:
    an electronic assembly that includes a frame formed from a unitary piece of material and a first electronic package mounted to the frame, the first electronic package including a first pin grid array, the electronic assembly further including a second electronic package mounted to the frame and separated laterally from the first electronic package, the second electronic package including a second pin grid array, the frame laterally surrounding the first and second electronic package; and
    a socket that includes a first receiving pin field and a second receiving pin field, the first pin receiving field including a first plurality electrical contacts and the second pin field including a second plurality electrical contacts; and
    an actuation mechanism that is configured to simultaneously laterally engage the first pin grid array with the first plurality electrical contacts and the second pin grid array with the second plurality electrical contacts during operation of the actuation mechanism.

10. The electronic system of claim 9, wherein the actuation mechanism is disposed laterally between the first electronic package and the second electronic package.

11. The electronic system of claim 9, wherein the socket includes a first socket that includes the first pin receiving field and a second socket that includes the second pin receiving field.

12. The electronic system of claim 9, further comprising:
    a first pin carrier attached to the first electronic package, wherein the first pin carrier includes the first pin grid array; and
    a second pin carrier attached to the second electronic package, wherein the second pin carrier includes the second pin grid array.

13. The electronic system of claim 12, wherein the first pin carrier is a same size as the second pin carrier.

14. The electronic system of aim 9, wherein the socket is mounted to a substrate.

15. The electronic system of claims 12, wherein the first pin carrier and the second pin carrier move linearly in a lateral direction relative to the frame during operation of the actuation mechanism.

16. A method comprising:
    inserting an electronic assembly into a socket, wherein the electronic assembly includes a frame formed from a unitary piece of material, a first electronic package mounted to the frame and a second electronic package mounted to the frame and separated laterally from the first electronic package; and
    operating an actuating mechanism that is part of the frame such that the first and second electronic packages electrically laterally engage the socket simultaneously.

17. The method of claim 16, wherein operating the actuating mechanism includes rotating a portion of the actuation mechanism.

18. The method of claim 17, wherein inserting an electronic assembly into a socket includes inserting a first pin grid array of the first electronic package into a first pin receiving field formed in the socket and inserting a second pin grid array of the second electronic package into a second pin receiving field formed in the socket.

19. The method of claim 18, wherein operating the actuating mechanism includes operating the actuating mechanism such that the first pin grid array laterally engages a first plurality of contacts in the first pin receiving field and the second pin grid array laterally engages a second plurality of contacts in the second pin receiving field.

20. The method of claim 18, wherein inserting the first pin grid array into the first pin receiving field includes inserting a first pin carrier that includes the first pin grid array into the first pin receiving field, wherein the first electronic package is attached to the first pin carrier, and wherein inserting the second pin grid array into the second pin receiving field includes inserting a second pin carrier that includes the second pin grid array into the second pin receiving field, wherein the second electronic package is attached to the second pin carrier.

21. The method of claim 18, wherein inserting the first pin grid array into the first pin receiving field includes inserting the first pin grid array into a first socket and inserting the second pin grid array into the second pin receiving field includes inserting the second pin grid array into a second socket.

22. The method of claim 16, further comprising removing the frame from the electronic system.

\* \* \* \* \*

UNITED STATES PATENT AND TRADEMARK OFFICE
CERTIFICATE OF CORRECTION

PATENT NO.        : 9,603,276 B2
APPLICATION NO.   : 14/583372
DATED             : March 21, 2017
INVENTOR(S)       : Llapitan et al.

Page 1 of 1

It is certified that error appears in the above-identified patent and that said Letters Patent is hereby corrected as shown below:

In the Claims

In Column 9, Line 47, in Claim 4, delete "in" and insert --pin-- therefor

In Column 9, Line 49, in Claim 4, delete "in" and insert --pin-- therefor

In Column 10, Line 40, in Claim 14, delete "aim 9," and insert --claim 9,-- therefor In Column 10, Line 42, in Claim 15, delete "claims 12," and insert --claim 12,-- therefor Signed and Sealed this
Twenty-eighth Day of May, 2019

Andrei Iancu
*Director of the United States Patent and Trademark Office*